United States Patent
Langer et al.

(10) Patent No.: US 8,497,737 B2
(45) Date of Patent: Jul. 30, 2013

(54) AMPLIFIER CIRCUIT, MOBILE COMMUNICATION DEVICE AND METHOD FOR ADJUSTING A BIAS OF A POWER AMPLIFIER

(75) Inventors: Andreas Langer, Unterschleissheim (DE); Christoph Hepp, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/073,067

(22) Filed: Mar. 28, 2011

(65) Prior Publication Data

US 2012/0249236 A1 Oct. 4, 2012

(51) Int. Cl.
*H03G 3/10* (2006.01)

(52) U.S. Cl.
USPC .......................................... 330/285; 330/296

(58) Field of Classification Search
USPC ................... 330/285, 296, 279, 302
See application file for complete search history.

(56) References Cited

U.S. PATENT DOCUMENTS

| | | | | |
|---|---|---|---|---|
| 3,852,999 A * | 12/1974 | Wright | ............................ | 73/588 |
| 3,992,678 A * | 11/1976 | Suzuki | ....................... | 330/207 P |
| 5,216,379 A * | 6/1993 | Hamley | ......................... | 330/134 |
| 5,977,831 A * | 11/1999 | Davis et al. | .................... | 330/279 |
| 6,762,647 B1 * | 7/2004 | Apel | ............................. | 330/279 |
| 6,794,935 B2 * | 9/2004 | Klomsdorf et al. | ........... | 330/129 |
| 6,965,837 B2 * | 11/2005 | Vintola | ........................... | 702/65 |
| 7,276,973 B2 * | 10/2007 | Ripley et al. | ................... | 330/296 |
| 7,482,873 B2 * | 1/2009 | Van Bezooijen et al. | ..... | 330/285 |
| 2002/0146993 A1 | 10/2002 | Persico et al. | | |
| 2011/0095827 A1 * | 4/2011 | Tanaka et al. | ................. | 330/279 |

* cited by examiner

*Primary Examiner* — Henry Choe
(74) *Attorney, Agent, or Firm* — Eschweiler & Associates, LLC

(57) ABSTRACT

An amplifier circuit includes a power amplifier configured to amplify an RF input signal to obtain an RF output signal, and a bias controller configured to control a bias of the power amplifier. The bias controller is configured to determine a measure of a load impedance of a load coupled to an output of the power amplifier and provide a bias control signal to adjust the bias of the power amplifier based on the determination of the measure of the load impedance.

18 Claims, 9 Drawing Sheets

AMPLIFIER CIRCUIT, MOBILE COMMUNICATION DEVICE AND METHOD FOR ADJUSTING A BIAS OF A POWER AMPLIFIER

FIELD

Embodiments of the invention relate to an amplifier circuit, a mobile communication device and a method for adjusting a bias of a power amplifier. Further embodiments of the invention relate to a power amplifier bias optimization based on a measured antenna impedance.

BACKGROUND

Conventional methods for adjusting a bias of a power amplifier comprise, for example, methods for reducing a bias current of the power amplifier based on a detected output power level. Such a reduction of the bias current is performed by using a conventional bias control approach. The bias control comprises, for example, a control of a driver for changing the supply voltage of the power amplifier based on certain input parameters. Conventional mobile communication devices including such a bias control are based, for example, on Wideband Code Division Multiple Access (WCDMA). WCDMA describes a multiple access method, while Universal Mobile Telecommunications System (UMTS) is the standard based thereon.

SUMMARY

Embodiments of the invention provide an amplifier circuit, wherein the amplifier circuit comprises a power amplifier for amplifying an RF input signal to obtain an RF output signal and a bias controller for controlling a bias of the power amplifier. The bias controller is configured to determine a measure of a load impedance of a load coupled to an output of the power amplifier and provide a bias control signal for adjusting the bias of the power amplifier based on the determination of the measure of the load impedance.

Embodiments of the invention provide an amplifier circuit, wherein the amplifier circuit comprises a power amplifier for amplifying an RF input signal based on a supply voltage to obtain an RF output signal, and a bias controller for controlling a bias of the power amplifier. The bias controller comprises an impedance determinator for determining a measure of a load impedance of a load coupled to an output of the power amplifier, and a mapping unit for mapping the measure of the load impedance to a mapped voltage, such that the mapped voltage is dependent on a phase of a reflection factor determined by the load impedance. The bias controller further comprises a DCDC converter configured to adjust the supply voltage of the power amplifier based on the mapped voltage. The mapping unit is configured to provide the mapped voltage such that an adjacent channel leakage power ratio (ACLR) value of the RF output signal lies within a predefined range for a plurality of load impedances resulting in reflection factors of equal magnitude.

Embodiments of the invention provide an amplifier circuit, wherein the amplifier circuit comprises means for amplifying an RF input signal to obtain an RF output signal and means for controlling a bias of the power amplifier. The means for controlling is configured to determine a measure of a load impedance of a load coupled to an output of the means for amplifying and to provide a bias control signal for adjusting the bias of the means for amplifying based on the determination of the measure of the load impedance.

Embodiments of the invention provide a mobile communication device for transmitting an RF output signal. The mobile communication device comprises a baseband generator for generating a baseband signal, and an RF signal generator for generating an RF signal based on the baseband signal. The device further comprises a power amplifier for receiving the RF signal from the RF signal generator and amplifying the received RF signal to obtain an RF output signal, and a bias controller for controlling a bias of the power amplifier. The bias controller is configured to determine a measure of a load impedance of a load coupled to an output of the power amplifier and provide a bias control signal for adjusting the bias of the power amplifier based on the determination of the measure of the load impedance. The mobile communication device further comprises an antenna for transmitting the RF output signal.

Embodiments of the invention provide a method for adjusting a bias of a power amplifier. The method comprises amplifying an RF input signal to obtain an RF output signal, and controlling the bias of the power amplifier. Controlling the bias comprises determining a measure of a load impedance of a load coupled to an output of the power amplifier, and providing a bias control signal for adjusting the bias of the power amplifier based on the determination of the measure of the load impedance.

BRIEF DESCRIPTION OF THE FIGURES

Embodiments according to the present invention will subsequently be described in reference to the enclosed Figures in which.

DETAILED DESCRIPTION

In the following, operation conditions and requirements of some mobile communication devices, in which the present invention may be used, will be described. Some embodiments according to the invention provide good performance under the condition discussed in the following.

Mobile terminals often have to cope with changing environmental conditions. The operating temperature range is typically between −10° C. up to 55° C. (according to 3GPP), while the supply voltage ranges typically between 3.0V and 4.3V. The latter is determined by the battery discharge characteristic and voltage drop during transmit operation. In addition, the radiated power of a mobile terminal strongly depends on the antenna conditions, e.g. free space, talk position (antenna covered by hand or close to head). The different antenna conditions result in different load impedances effective at power amplifier output. In some cases, the power amplifier may need to cope with a wide range of load impedances. Antenna mismatch causes, for instance, spectral regrowth issues in transmission schemes with a non-constant envelope such as UMTS and LTE (Long Term Evolution). Both standards have stringent limits for the leakage power on adjacent channels, so-called ACLR (adjacent channel leakage power ratio) requirements.

Therefore, a need exists for an approach of adjusting a bias of a power amplifier allowing to achieve a good trade-off between an improved ACLR performance, a low current consumption and the computational complexity.

Embodiments of the invention achieve the just-mentioned trade-off by measuring a load impedance of a load coupled to an output of the power amplifier and adjusting a bias control signal of the power amplifier based on the determination of the load impedance measurement. In this way, it is possible to reduce the ACLR degradation under mismatch, so that the ACLR performance can be maintained with comparatively low effort and/or comparatively low current consumption.

Figure 1:
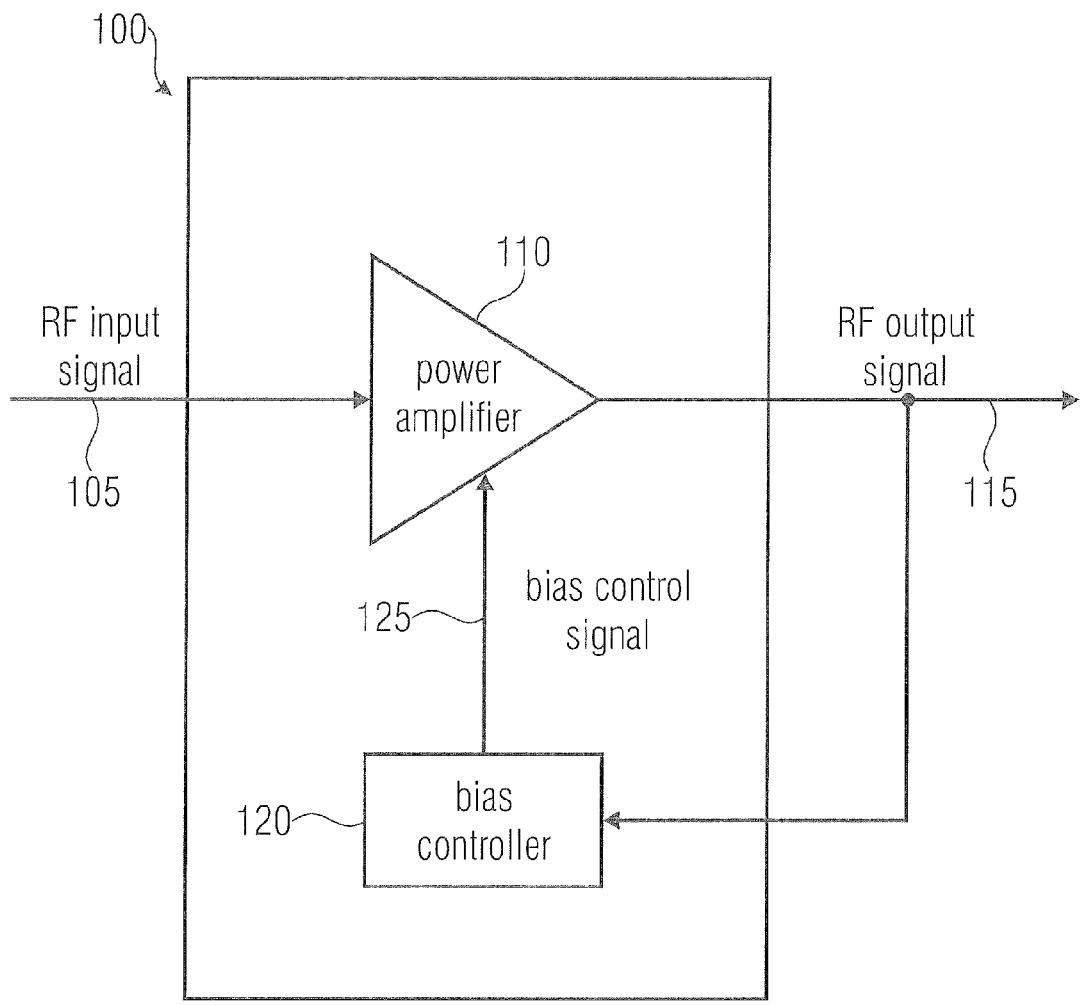
FIG. 1 shows a block diagram of an embodiment of an amplifier circuit including a bias controller.

FIG. 1 shows a block diagram of an embodiment of an amplifier circuit 100 including a bias controller 120. As shown in FIG. 1, the amplifier circuit 100 comprises a power amplifier 110 and a bias controller 120. Here, the power amplifier 110 is configured to amplify an RF input signal 105 to obtain an RF output signal 115. Moreover, the bias controller 120 is configured to control a bias of the power amplifier 110. The RF input signal 105 may comprise a plurality of frequencies in specific frequency bands, such as defined by the UMTS standard (or may be switchable between a plurality of frequencies). Referring to the embodiment of FIG. 1, the bias controller 120 is configured to determine a measure of a load impedance of a load coupled to an output of the power amplifier 110 and provide a bias control signal 125 for adjusting the bias of the power amplifier 110 based on the determination of the measure of the load impedance. Such a measure of the load impedance is, for example, a quantity that is dependent on the load impedance. The RF output signal 115 obtained at the output of the amplifier circuit 100 represents an amplified version of the RF input signal 105.

Figure 2:
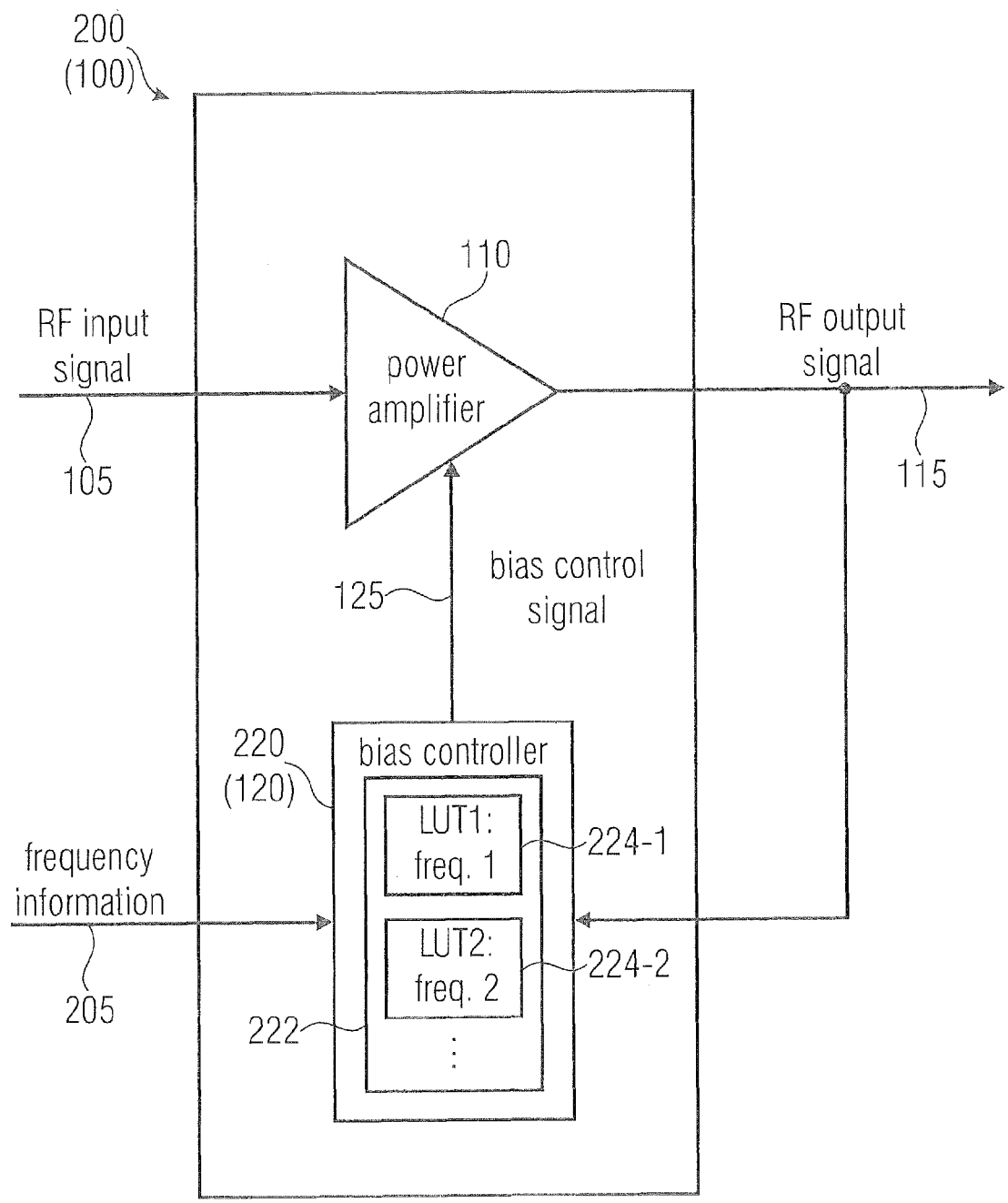
FIG. 2 shows a block diagram of a further embodiment of an amplifier circuit including a bias controller with different look-up tables.

FIG. 2 shows a block diagram of a further embodiment of an amplifier circuit 200 including a bias controller 220 with different look-up tables (224-1, 224-2 . . . ). Here, the amplifier circuit 200 of FIG. 2 essentially comprises the same blocks as the amplifier circuit 100 of FIG. 1. Therefore, identical blocks having similar implementations and/or functions are denoted by the same numerals. Moreover, the bias controller 220 of the amplifier circuit 200 shown in FIG. 2 may correspond to the bias controller 120 of the amplifier circuit 100 shown in FIG. 1. Referring to the embodiment of FIG. 2, the bias controller 220 may comprise a look-up table 222 configured to store a plurality of bias voltage values associated with corresponding values of a reflection factor for a plurality of load impedances, such that the bias voltage values are dependent on a phase and amplitude (magnitude) of corresponding reflection factors for reflection factors of equal magnitude (e.g. for reflection factors resulting in the same VSWR or Voltage Standing Wave Ratio). The bias controller 220 is configured to extract an individual bias voltage value from the look-up table 222, wherein the individual bias voltage value may correspond to a value of a reflection factor determined by the load impedance. Here, the bias controller 220 is configured to provide the bias control signal 125 to adjust the bias of the power amplifier 110 based on the individual bias voltage extracted from the look-up table 222.

It is also shown in FIG. 2 that the bias controller 220 may comprise different look-up tables 224-1, 224-2 . . . for a plurality of frequencies of the RF input signal 105. Here, the different look-up tables 224-1, 224-2 . . . are denoted by 'LUT1: freq. 1', 'LUT2: freq. 2' . . . , indicating that same correspond to different frequencies (freq. 1, freq. 2 . . . ) of the RF input signal 105. The look-up tables 224-1, 224-2 may be considered as sub-tables of the look-up table 222, as shown in FIG. 2. However, the look-up tables 224-1, 224-2 may alternatively take the place of the look-up table 222. Referring to the embodiment of FIG. 2, each of the look-up tables (or sub-tables) 224-1, 224-2 . . . may be configured to store a plurality of bias voltage values associated with corresponding values of a reflection factor for a plurality of load impedances, such that the bias voltage values are dependent on a phase of corresponding reflection factors for reflection factors of equal magnitude.

Additionally, the bias controller 220 may also be configured to extract an individual bias voltage value from a selected look-up table associated with a current frequency of the RF input signal 105. In one embodiment the individual bias voltage value corresponds to a phase of a reflection factor determined by the load impedance for the current frequency of the RF input signal 105. It is pointed out that in one embodiment the current frequency of the RF input signal 105 is indicated by the frequency information 205 received by the bias controller 220 comprising the different look-up tables or look-up sub-tables (224-1, 224-2 . . . ). In the embodiment of FIG. 2, the bias controller 220 is configured to provide the bias control signal 125 to adjust the bias of the power amplifier 110 based on the individual bias voltage value extracted from the selected look-up table.

Figure 3:
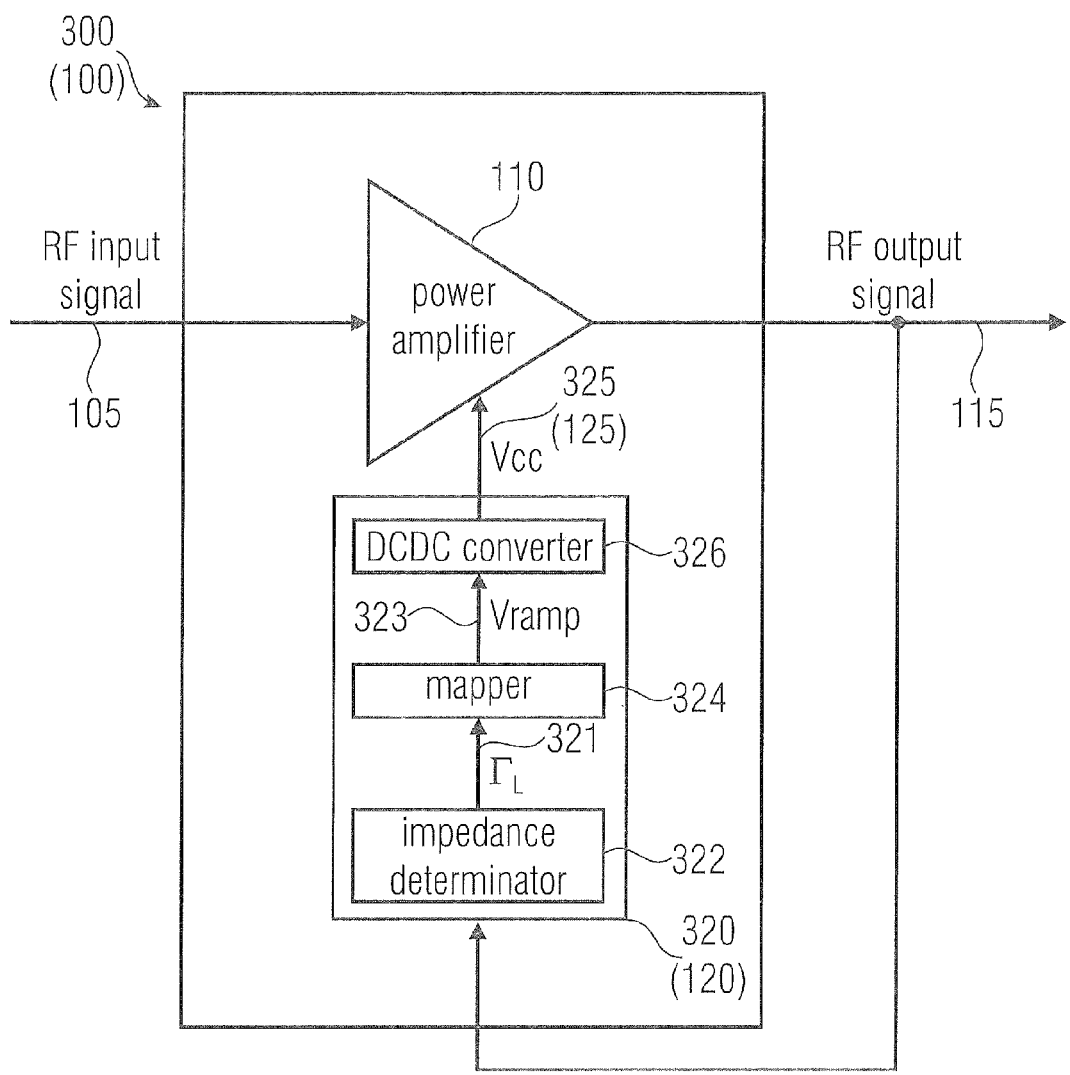
FIG. 3 shows a block diagram of a further embodiment of an amplifier circuit including a bias controller with an impedance determinator, a mapping unit and a DCDC converter.

FIG. 3 shows a block diagram of a further embodiment of an amplifier circuit 300 including a bias controller 320 with an impedance determinator 322, a mapping unit 324 and a DCDC converter 326. Here, the amplifier circuit 300 of FIG. 3 essentially comprises the same blocks as the amplifier circuit 100 of FIG. 1. Therefore, identical blocks having similar implementations and/or functions are denoted by the same numerals. Moreover, the bias controller 320 and a power amplifier supply voltage 325, Vcc, of the amplifier circuit 300 shown in FIG. 3 corresponds to the bias controller 120 and the bias control signal 125 of the amplifier circuit 100 shown in FIG. 1. Referring to the embodiment of FIG. 3, the amplifier circuit 300 comprises a power amplifier 110 for amplifying an RF input signal 105 based on the power amplifier supply voltage 325, Vcc, to obtain an RF output signal 115. It can also be seen in FIG. 3 that the bias controller 320 of the amplifier circuit 300 comprises an impedance determinator 322, a mapping unit 324 and a DCDC converter 326. Here, the impedance determinator 322 is configured to determine a measure 321, $\Gamma_L$, of a load impedance of a load coupled to an output of the power amplifier 110, for example in the form of a reflection factor $\Gamma_L$. The mapping unit 324 is configured to map the measure 321 of the load impedance to a mapped voltage 323, Vramp, such that the mapped voltage Vramp is dependent on a phase and amplitude of the reflection factor $\Gamma_L$ determined by the load impedance. Here, $\Gamma_L$ is just a different representation of the load impedance as an S-parameter considering a predetermined reference impedance. The DCDC converter 326 is configured to adjust the supply voltage 325 of the power amplifier 110 based on the mapped voltage 323. In the embodiment of FIG. 3, the mapping unit 324 is configured to provide the mapped voltage 323 such that an adjacent channel leakage power ratio (ACLR) value of the RF output signal 115 lies within a predefined range for a plurality of load impedances resulting in reflection factors of equal magnitude and different phase.

Figure 4:
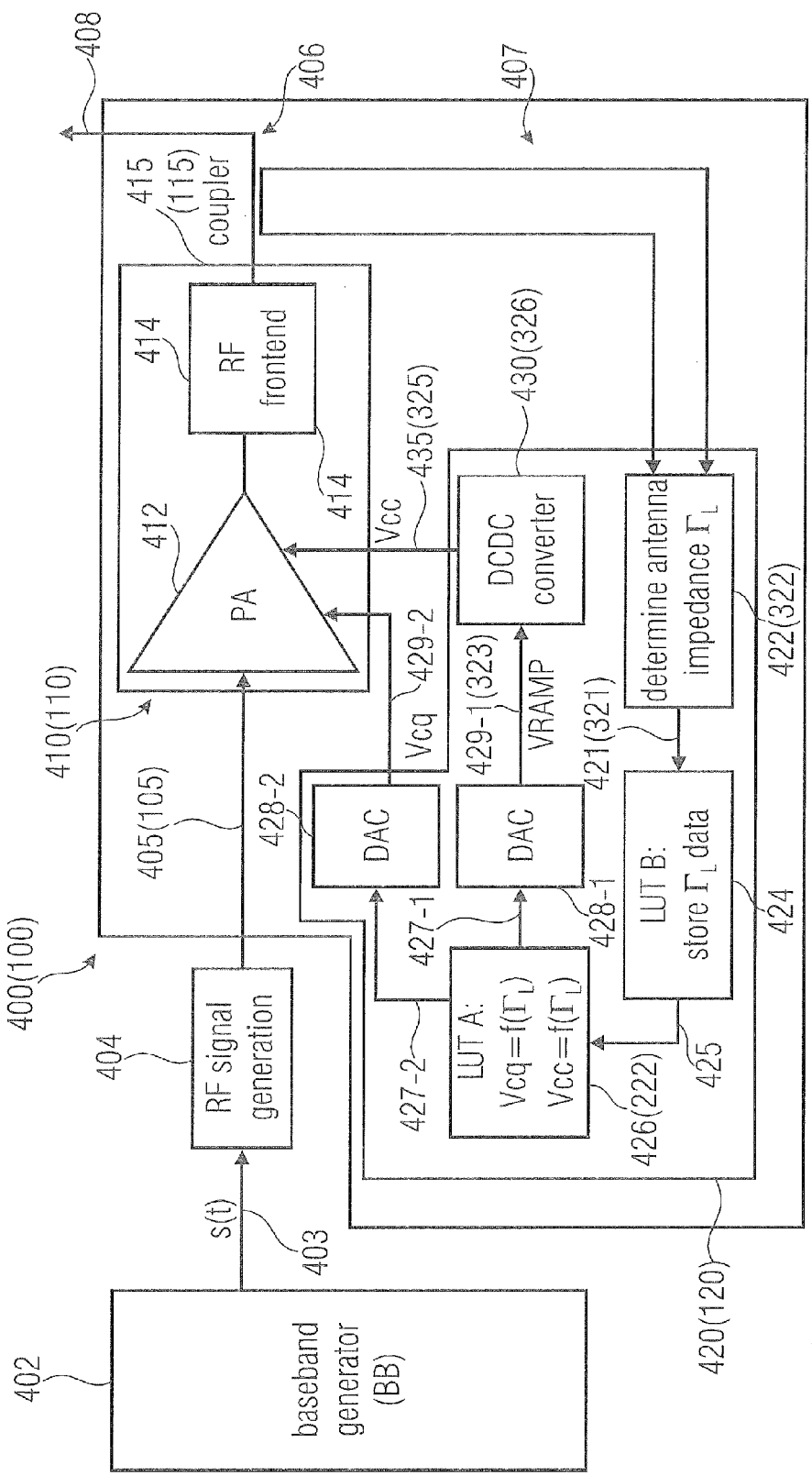
FIG. 4 shows a block diagram of a further embodiment of an amplifier circuit including a bias controller with an impedance information look-up table.

FIG. 4 shows a block diagram of a further embodiment of an amplifier circuit 400 including a bias controller 420 with an impedance information look-up table 424 (LUT B). As shown in FIG. 4, the amplifier circuit 400 comprises a power amplifier 410, a bias controller 420 and a directional coupler 406. Here, the power amplifier 410 and the bias controller 420 of the amplifier circuit 400 shown in FIG. 4 may correspond to the power amplifier 110 and the bias controller 120 of the amplifier circuit 100 shown in FIG. 1. In the embodiment of FIG. 4, a baseband generator 402 (baseband generator 'BB') and an RF signal generator 404 ('RF signal generation') are also shown. In particular, the baseband generator 402 is configured to generate a baseband signal 403, s(t), while the RF signal generator 404 is configured to generate an RF signal 405 on the basis of the baseband signal 403, s(t). It can also be seen in FIG. 4 that the power amplifier 410 is configured to receive the RF signal 405 from the RF signal generator 404 to obtain an RF output signal 415. Here, the RF signal 405 received by the power amplifier 410 and the RF output signal 415 output by the power amplifier 410 as shown in the embodiment of FIG. 4 correspond to the RF input signal 105 received by the power amplifier 110 and the RF output signal 115 output by the power amplifier 110 as shown in the embodiment of FIG. 1. Moreover, the power amplifier 410 of FIG. 4 comprises a power amplifier unit 412 connected to an RF front end 414.

The directional coupler 406 of the amplifier circuit 400 is coupled to the output of the power amplifier unit 412 or to the output of the RF frontend 414 such that it can be used to perform a reflection factor measurement in dependence on a load impedance.

Referring to the embodiment of FIG. 4, the bias controller 420 of the amplifier circuit 400 comprises an impedance determinator 422, an impedance information look-up table 424 (LUT B), a look-up table 426 (LUT A), a first digital-to-analog converter (DAC) 428-1, a second digital-to-analog converter (DAC) 428-2 and a DCDC converter 430. Here, the impedance determinator 422 is denoted by 'determine antenna impedance $\Gamma_L$', while the impedance information look-up table 424 and the look-up table 426 are denoted by 'LUT B: store $\Gamma_L$ data' and 'LUT A: Vcq=f($\Gamma_L$); Vcc=f($\Gamma_L$)', respectively. Moreover, the look-up table 426 of FIG. 4 may correspond to the look-up table 222 of FIG. 2, while the impedance determinator 422 and the DCDC converter 430 of FIG. 4 may correspond to the impedance determinator 322 and the DCDC converter 326 of FIG. 3.

According to the embodiment of FIG. 4, the directional coupler 406 is configured to provide a measurement signal 407 representing, for example, a complex load impedance and forward the provided measurement signal 407 to the impedance determinator 422 of the bias controller 420. The impedance determinator 422 may, in turn, be configured to determine a measure 421, $\Gamma_L$, of the (complex-valued) load impedance, such as a complex-valued reflection factor $\Gamma_L$. Here, the measure 421, $\Gamma_L$, of the load impedance obtained by the impedance determinator 422 as shown in FIG. 4 may correspond to the measure 321, $\Gamma_L$, of the load impedance obtained by the impedance determinator 322 as shown in FIG. 3.

In the embodiment of FIG. 4, the impedance information look-up table 424 of the bias controller 420 may be configured for storing a plurality of measures of a load impedance for corresponding frequencies of the RF input signal 405 based on the measured impedance information 421, $\Gamma_L$. In addition, the bias controller 420 is configured to extract an individual measure 425 of a load impedance from the impedance information look-up table 424 (LUT B). Here, the individual measure 425 of the load impedance may correspond to a frequency of the RF input signal 405 such as in a frequency hopping mode. Moreover, the bias controller 420 is configured to provide the bias control signal to adjust the bias of the power amplifier 410 based on the individual measure 425 of the load impedance extracted from the impedance information look-up table 424. Accordingly, a currently measured impedance value 421 may be used as the impedance measure 425 if the look-up table 424 does not comprise a stored, previously measured impedance value, and a stored, previously measured impedance value from the look-up table 424 may be used as the impedance measure 425 otherwise.

As depicted in the embodiment of FIG. 4, the bias controller 420 is configured to extract a first and a second digital bias voltage value 427-1, 427-2 from the look-up table 426 based on the individual measure 425 of the load impedance extracted from the impedance information look-up table 424 or based on a measured impedance information 421. In one embodiment the first and second digital bias voltage values 427-1, 427-2 represent voltages Vcc or Vcq derived from a functional dependence on a measure of the load impedance or the reflection factor, respectively.

The first and second digital bias voltage values 427-1, 427-2 extracted from the look-up table 426 are converted into a first analog bias voltage value 429-1, Vramp, and a second analog bias voltage value 429-2, Vcq, by the first and second digital-to-analog converters 428-1, 428-2, respectively. The DCDC converter 430 of the bias controller 420 is configured to adjust the supply voltage 435, Vcc, of the power amplifier 412 based on the first analog bias voltage value 429-1, Vramp. Here, the first analog bias voltage value 429-1 and the supply voltage 435 in the embodiment of FIG. 4 essentially correspond to the mapped voltage 323 and the supply voltage 325 in the embodiment of FIG. 3, respectively.

In other words, the DCDC converter 430 is configured to adjust a supply voltage 435 of the power amplifier 410 based on a mapped voltage 429-1 determined by an entry of a look-up table 426 (LUT A).

Therefore, as shown in FIG. 4, in one embodiment the bias controller 420 is configured to provide a first bias control signal to adjust a supply voltage 435, Vcc, of the power amplifier 410. In addition, the bias controller 420 is configured to provide a second bias control signal to adjust an input-sided bias voltage 429-2, Vcq, to adjust a quiescent current of the power amplifier 410.

Specifically, in the embodiment of FIG. 4, the power amplifier 412 is configured to amplify the RF input signal 405 based on the supply voltage 435 and a quiescent current adjusted by an input-sided bias voltage 429-2 (which input-sided bias voltage may, for example, adjust a gate bias or base bias of an amplifier transistor).

Figure 5:
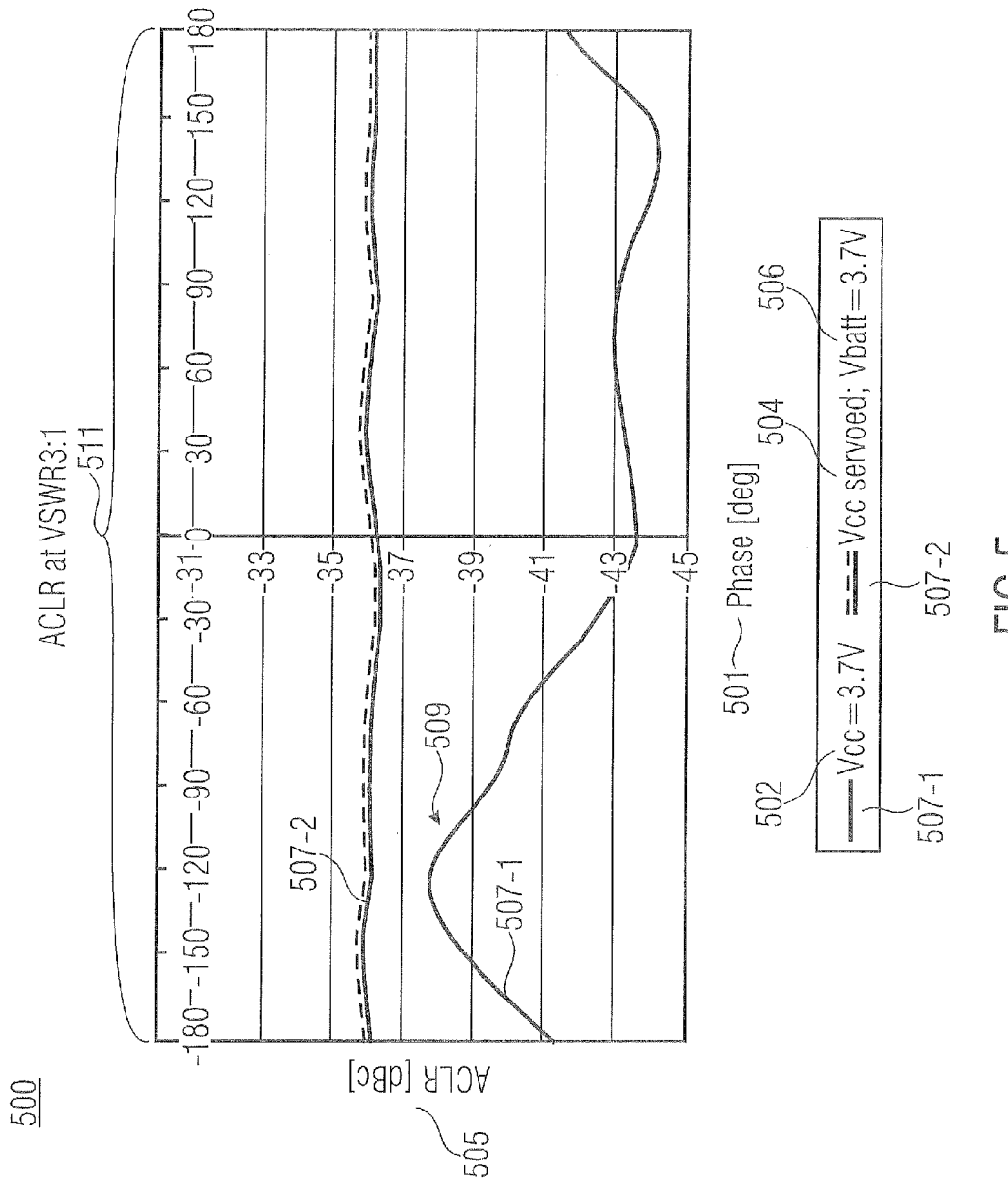
FIG. 5 shows a graph of an example dependence of an adjacent channel leakage power ratio (ACLR) value on a phase of a reflection factor.

FIG. 5 shows a graph 500 of an example dependence of an adjacent channel leakage power ratio (ACLR) value 505 on a phase 501 of a reflection factor. Specifically, in FIG. 5, the ACLR over load phase for Vcc=constant=3.7V and 'Vcc servoed' is shown. Here, the reflection factor may correspond to the reflection factor 321, 421 obtained from the impedance determinator 322 or 422 in the embodiments of FIG. 3 or 4, respectively. Since the reflection factor is essentially determined by the load impedance of a load coupled to an output of the power amplifier, the phase 501 of the reflection factor can also be referred to as a "load phase". The adjacent channel leakage power ratio (ACLR) value 505 (in dBc) is typically defined as the ratio of the transmitted power, such as the power in the UMTS transmission channel selected for communication, to the power in the adjacent channel (or as the inverse thereof). Thus, the ACLR value 505 represents a measure of the power leakage into the adjacent channel, wherein a smaller ACLR value (in dBc) essentially corresponds to a better ACLR performance.

According to embodiments of the invention, the power amplifier may be configured as, for example, a single-ended power amplifier such that, for a constant supply voltage 502 (e.g. Vcc=3.7V) of the power amplifier, a dependence of the ACLR value 505 of the RF output signal on the phase 501 (in deg or degrees) of a reflection factor for a plurality of load impedances resulting in reflection factors of equal magnitude (i.e. for a given VSWR), such as represented by a first curve 507-1 in the graph 500 of FIG. 5, comprises, for example, a single peak 509 within a total phase angle range 511 between −180 and 180°. Here, it is to be noted that in the graph 500 of FIG. 5, the battery voltage 506, Vbatt, used for operating the amplifier circuit has an example value of 3.7V.

Figure 6:
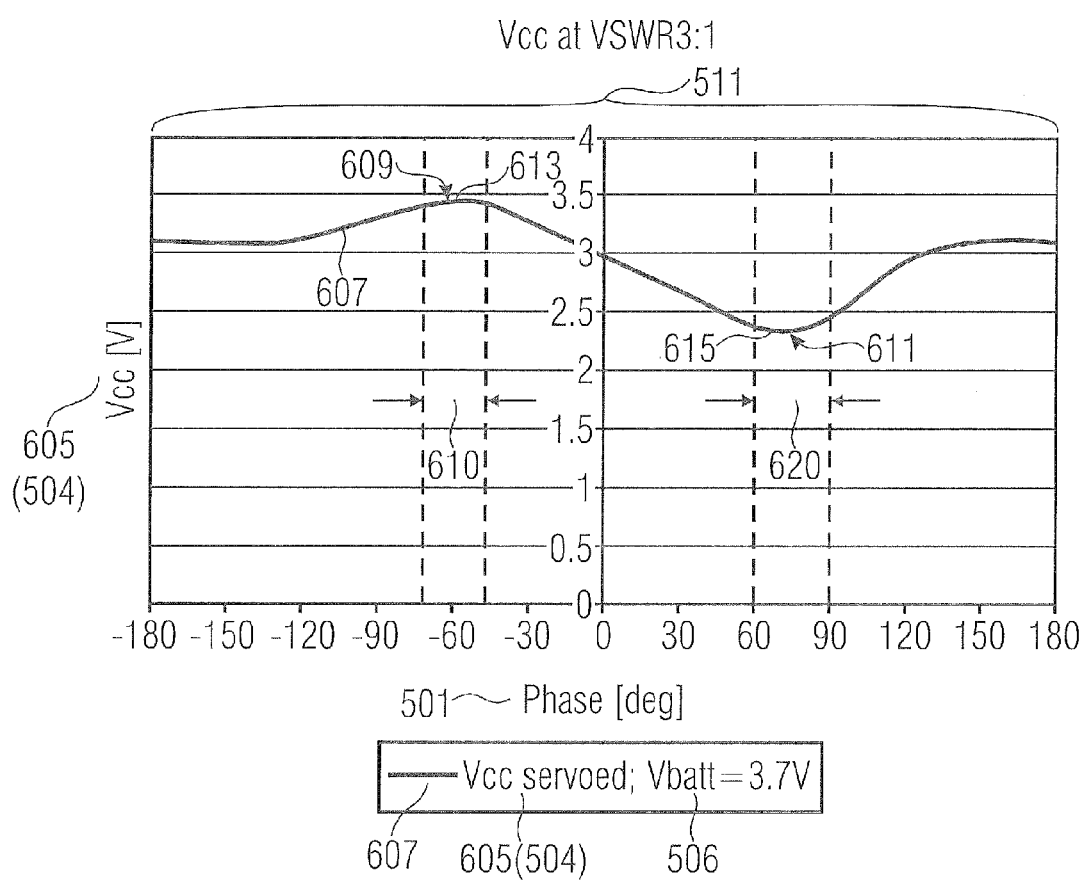
FIG. 6 shows a graph of an example dependence of a supply voltage on a phase of a reflection factor.
Figure 7:
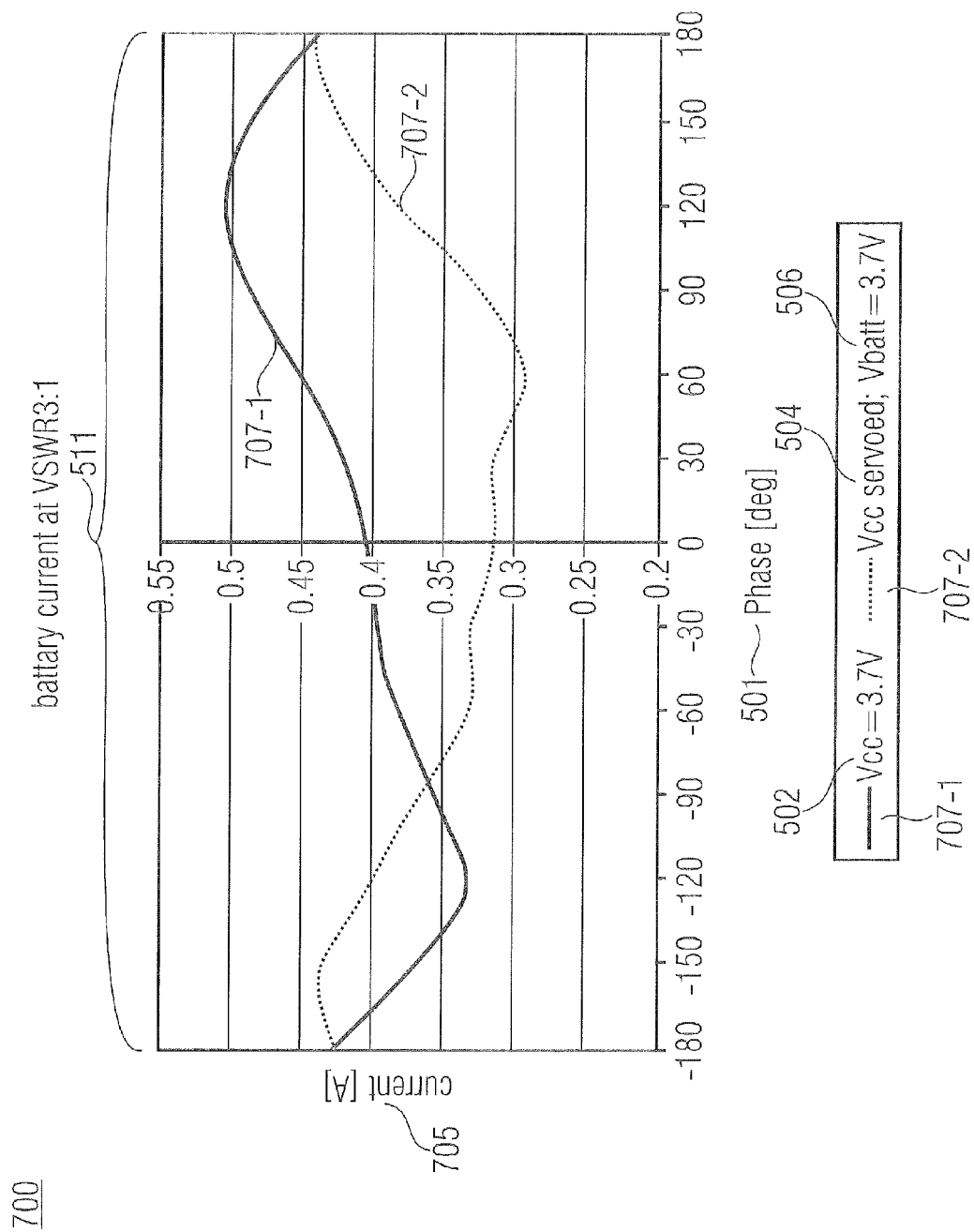
FIG. 7 shows a graph of an example dependence of a battery current on a phase of a reflection factor.

It is also pointed out here that in the graphs 500, 600 and 700 of FIGS. 5, 6 and 7, the dependencies (i.e. ACLR value, supply voltage and battery current) are specifically shown for an example Voltage Standing Wave Ratio (VSWR) value of 3:1. The Voltage Standing Wave Ratio is typically defined as the ratio of a maximum voltage (Vmax) and a minimum voltage (Vmin) of a standing wave and depends on the magnitude of the reflection factor ($\Gamma_L$) determined by the load impedance, as it is well known to one skilled in the art. Here, the maximum voltage Vmax essentially corresponds to the sum of the voltage $V_F$ of a forward propagating wave at the output of the power amplifier and the voltage $V_R$ of a reflected wave reflected by the load impedance of a load coupled to the output of the power amplifier (i.e. Vmax=$V_F$+$V_R$), while the minimum voltage $V_{min}$ essentially corresponds to the difference between the voltage $V_F$ of the forward propagating wave and the voltage $V_R$ of the reflected wave (i.e. Vmin=$V_F$−$V_R$):

The condition that the VSWR value is constant in the graphs of FIGS. 5-7 means that the corresponding dependencies are associated with a plurality of load impedances resulting in reflection factors of equal magnitude.

In embodiments related to FIG. 5, the bias controller of the amplifier circuit is configured to provide a variable supply voltage 435, 504 denoted by 'Vcc servoed' for the power amplifier such that the ACLR value 505 based on the phase 501 of corresponding reflection factors for reflection factors of equal magnitude lies within a predefined range within the total phase angle range 511. Such an ACLR value 505 based on the phase 501 is represented in the graph 500 of FIG. 5 by a second curve 507-2 showing a nearly constant behavior over the entire phase angle range. In particular, the second curve 507-2 of the graph 500 of FIG. 5 may have ACLR values lying, for example, in the predefined range between −37 and −35 dBc, while preferably, the variable supply voltage 435, 504 may be adjusted to obtain constant ACLR values of about −36 dBc. Accordingly, the entries of the look-up table 426 may be chosen to adjust the voltage 435 based on the phase of the reflection factor $\Gamma_L$ (represented by information 425) such that the ACLR is approximately constant (for example, varies by less than ±2 dB, or even by less than ±1 dB) over the full phase range from −180° to +180°.

FIG. 6 shows a graph 600 of an example dependence of a supply voltage 435, 605 on a phase 501 of a reflection factor (for example, the reflection factor $\Gamma_L$). Specifically, in FIG. 6, the Vcc over load phase is shown if Vcc is servoed to obtain a constant ACLR value. In the graph 600 of FIG. 6, a curve 607 is shown representing the supply voltage 435, 605, Vcc (in V), as a function of the phase 501 of corresponding reflection factors (for example, the reflection factor $\Gamma_L$) for reflection factors of equal magnitude (VSWR=3:1) over the total phase angle range 511. Here, the supply voltage 605 depicted in the graph 600 of FIG. 6 may correspond to the supply voltage 435, 504 (Vcc servoed) provided for the power amplifier as described with regard to FIG. 5. The supply voltage Vcc, as shown in FIG. 6, may, for example, be provided by the cooperation of the look-up table 426, the DAC 428-1 and the DCDC converter 430.

It can be seen in the graph 600 of FIG. 6 that the curve 607 showing the supply voltage 435, 605 as function of the phase 501 of a reflection factor for a plurality of load impedances resulting in reflection factors of equal magnitude is, for example, characterized by a peak 609 in a first phase angle region 610 for phase angles between −70° and −50° and a valley 611 in a second phase angle region 620 for phase angles between 60° and 90°.

In embodiments referring to FIG. 6, a variation ratio of the supply voltage 605 is, for example, less than 1.5:1 over the total phase angle range 511, wherein the variation ratio can be defined as the ratio of the maximum value 613 and the minimum value 615 of the curve 607.

FIG. 7 shows a graph 700 of an example dependence of a battery current 705 on a phase 501 of a reflection factor. Specifically, in FIG. 7, the battery current over load phase for Vcc=constant=3.7V and 'Vcc servoed' is shown. The graph 700 of FIG. 7 essentially comprises the same components as the graph 500 of FIG. 5. Therefore, identical components are denoted by the same numerals. In the graph 700 of FIG. 7, a first and a second curve 707-1, 707-2 representing the current 705 (in A) as a function of the phase 501 (load phase) are depicted within the total phase angle range 511. Here, the phase 501 of the graph 700 shown in FIG. 7 corresponds to reflection factors for reflection factors of equal magnitude as in the graph 500 and 600 of FIGS. 5 and 6 (VSWR=3:1). In addition, the first curve 707-1 corresponds to a constant supply voltage 502 of 3.7V, while the second curve 707-2 corresponds to the variable supply voltage 504 (Vcc servoed). The battery voltage 506 for the amplifier circuit is set to an example value of 3.7V. It can clearly be seen in FIG. 7 that in the case of using the variable or servoed supply voltage 504, the battery current 705 consumed by the power amplifier can be significantly reduced when compared to the case of using the constant supply voltage 502 at least over a significant phase range. Correspondingly, the second curve 707-2 lies at least partially below the first curve 707-1 in the graph 700 of FIG. 7. This is especially the case for phase angles larger than approximately −80°. Thus, by adjusting the supply voltage of the power amplifier based on the load phase, to obtain an ACLR value of the RF output signal which lies within a predefined range, the current consumption of the power amplifier can be reduced.

To recap the embodiment described with regard to FIG. 4, the load impedance of a load, such as an antenna (antenna 408 of FIG. 4), coupled to the output of the power amplifier or the antenna impedance can be measured by means of a directional coupler. However, each method which provides phase and magnitude of the antenna impedance can be applicable for embodiments of the invention. The use of a directional coupler is one implementation, but there are other approaches which can also provide the load impedance. A DCDC converter can be used to set the supply voltage Vcc of the power amplifier. According to further embodiments of the present invention, the DCDC converter can also be realized as a buck-only, boost-only or a buck-boost converter. The supply voltage Vcc applied to the power amplifier determines the linear output power capability of the power amplifier. The higher the supply voltage is, the higher is the maximum linear output power of the power amplifier. However, a high supply voltage also means a high battery current due to a lower conversion ratio of the DCDC converter. Thus, the supply voltage is preferably set to a value which should be as low as possible to save battery current, but still high enough to ensure good ACLR performance under all conditions. The look-up table (LUT A) can be used to set the bias of the power amplifier depending on the load phase. The impedance information look-up table (LUT B) can be used to store the measured load impedances, e.g. depending on transmit channel or frequency information (for example, to be able to rapidly adjust the power amplifier bias in the case of a frequency change).

The basic concept of the invention will be summarized in the following. FIG. 5 shows the ACLR performance over load phase at VSWR 3:1 load mismatch in two different cases. In the first case, the supply voltage Vcc of the power amplifier is constant at 3.7V and in the second case, the supply voltage Vcc is optimized to keep an example ACLR target of −36 dBc over load phase.

If the supply voltage Vcc is constant at 3.7V or any other value inside battery voltage range, the ACLR performance clearly depends on the load phase angle. This is typical for all linear power amplifiers. Merely the characteristics are different depending on the power amplifier architecture. Single-ended power amplifiers have one maximum over phase as depicted in FIG. 5. Here, the maximum occurs at −120 deg, whereas balanced amplifiers have two maximum values due to the 90 deg hybrid. It can be seen in FIG. 5 that for some phase angles, the ACLR value is much better than needed if Vcc is kept constant. This typical behavior can be used to lower the supply voltage Vcc depending on the phase which means that the Vcc voltage can be reduced at the expense of ACLR headroom. This is also depicted in FIG. 5 as case "Vcc servoed". Here "Vcc servoed" means that the power amplifier supply voltage Vcc at each phase angle is adjusted such that the ACLR value will be constant (−36 dBc in this example). This adjustment of the supply voltage Vcc can, for example, be achieved by choosing the entries of the look-up table (LUT A) in dependence on the load phase such that the ACLR is approximately constant (for example, varies by less than ±2 dB, or even by less than ±1 dB) over the full phase range from −180° to +180°.

FIG. 6 shows the corresponding Vcc response (for example, the Vcc response provided by the cooperation of the look-up table 426, the DAC 428-1 and the DCDC converter 430 in the embodiment of FIG. 4) over phase angle. The Vcc variation is more than 1V over phase angle. Phase angles which correspond to the so-called high impedance range of the power amplifier (−60 deg in this example) may, for example, require a high supply voltage preventing the power amplifier from voltage saturation; phase angles which correspond to the low impedance phase range of power amplifier (60 . . . 90 deg) allow a lower supply voltage.

FIG. 7 shows the impact on the battery current. If Vcc is servoed for constant ACLR in accordance with an embodiment of the invention, the battery current can be greatly reduced, which is a benefit of this invention.

The proper Vcc setting may require knowledge about the load impedance. If the load impedance is known, the Vcc voltage can be set to the lowest possible value, which is high enough to maintain a certain target ACLR performance as shown in FIG. 6. This method also significantly reduces the 50 Ohm current which is important for benchmarking. In case of Vcc=constant, the battery current of 50 Ohm is roughly 370 mA for this power amplifier type. In case of "Vcc servoed" to an ACLR target of −36 dBc, the battery current is 297 mA at Vbatt=3.7V. The required Vcc to achieve an ACLR value of −36 dBc at 50 Ohm is, for example, 2.8V. If the battery voltage is 3.7V, the conversion ratio is 3.7V/2.8V=1.32. Assuming a DCDC converter efficiency of 93%, the current is reduced by a factor 1.32*0.93=1.23. By removing the power headroom which is not needed at 50 Ohm, the battery current can, for example, be reduced by more than 20%, which would result in best class current consumption performance.

Figure 8:
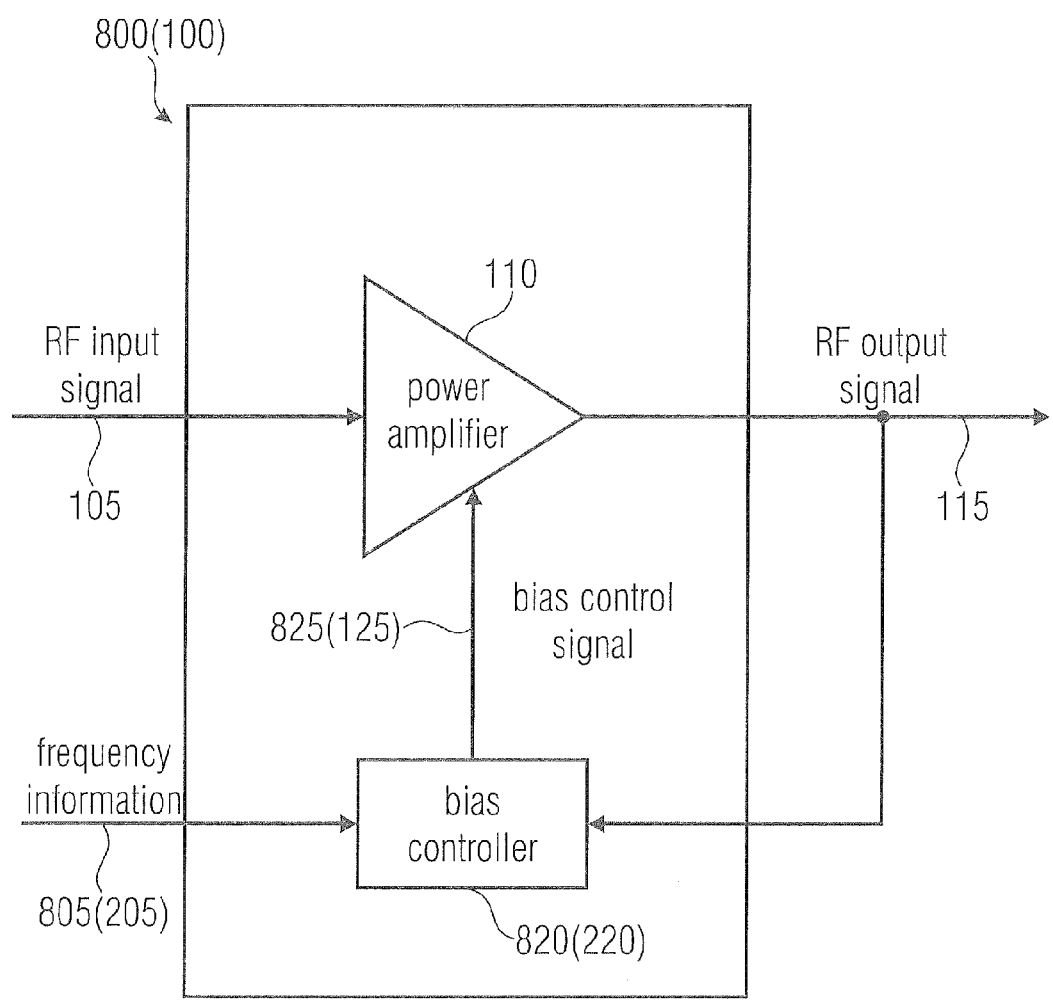
FIG. 8 shows a block diagram of a further embodiment of an amplifier circuit including a bias controller for receiving frequency information.

FIG. 8 shows a block diagram of a further embodiment of an amplifier circuit 800 including a bias controller 820 for receiving frequency information 805. The amplifier circuit 800 of FIG. 8 essentially comprises the same blocks as the amplifier circuit 100 of FIG. 1. Therefore, identical blocks having similar implementations and/or functions are denoted by the same numerals. However, in the embodiment of FIG. 8, the bias controller 820 of the amplifier circuit 800 is configured to perform the following steps. First, a maximum bias control signal is provided to set the bias of the power amplifier 110 to a maximum level before an initial time slot of a sequence of time slots. Subsequently, the measure $\Gamma_L$ of the load impedance is determined. Finally, a bias control signal 825 that is different from the maximum bias control signal is provided to adjust the bias of the power amplifier 110 based on the determination of the measure $\Gamma_L$ of the load impedance for a consecutive time slot of the sequence of time slots.

For example, the bias controller 820 is configured to perform the steps described with regard to the embodiment of FIG. 8 for each frequency of a hopping sequence. Here, each of the frequencies of the hopping sequence such as in a frequency hopping mode may be indicated by frequency information 805 received by the bias controller 820. The frequency information 805 received by the bias controller 820 of FIG. 8 may correspond to the frequency information 205 received by the bias controller 220 of FIG. 2. Thus, in the embodiments of FIGS. 2 and 8, the bias controller 220 or 820 is configured to provide the bias control signal 125, 825 for the power amplifier 110 based on the frequency information 205, 805, respectively.

According to the embodiment of FIG. 8, the bias controller 820 of the amplifier circuit 800 is configured to store measures of the load impedance for a plurality of frequencies, and to reuse the stored measures of the load impedance when returning to a frequency previously used in the hopping sequence.

In accordance with further embodiments, the procedure described above with respect to FIG. 8 may comprise the following steps. First, if the antenna impedance is unknown (e.g. before a first slot or frequency change), the bias of the power amplifier is set to a high level which ensures reasonable ACLR performance independent of the antenna impedance. Then, during a next transmission slot, the antenna impedance is measured. Then, depending on the measured impedance, the bias voltage is set for the next slot. In embodiments, the bias control may change the supply voltage and/or the quiescent current of the power amplifier. This is also called dual bias control. In the embodiment described above with regard to FIG. 4, only (or preferably) the Vcc level is changed. Here, it is pointed out that the dual bias control will further reduce the current consumption, but increase the complexity.

Additionally, if the mobile device operates in a frequency hopping mode, the just-mentioned procedure steps can be independently applied to each hopping frequency. This can be achieved by a dedicated table (e.g. LUT B in the embodiment of FIG. 4) which stores the impedance data for each channel.

Again referring to the embodiment of FIG. 4, the relation between the load impedance and the bias condition is included in the look-up table LUT A. This look-up table may, in some cases, be needed for each band which is supported by the mobile device and can be determined by lab measurements. For each band, in some cases, there should be multiple frequency points to compensate the frequency response of the power amplifier. This is especially the case in bands which include a duplexer. It is not necessary to have a table for each output power level. A normalized table relative to the 50 Ohm bias is sufficient.

In a further embodiment, the same procedure as described above can be applied to 2G mobile devices to reduce the maximum current under mismatch. The reduction of the maximum current is a severe issue due to excessive heat dissipation, especially for Smart Phones. If the antenna impedance is in the low impedance range of the power amplifier (phase range where the power amplifier draws highest current), the output power can be reduced to keep dissipated heat below a certain value. If the 2G power amplifier was supplied by a DCDC converter, the supply voltage could be lowered to reduce battery current. By evaluating the load impedance, the heat dissipation can be easily limited which is important for the phone suppliers.

Figure 9:
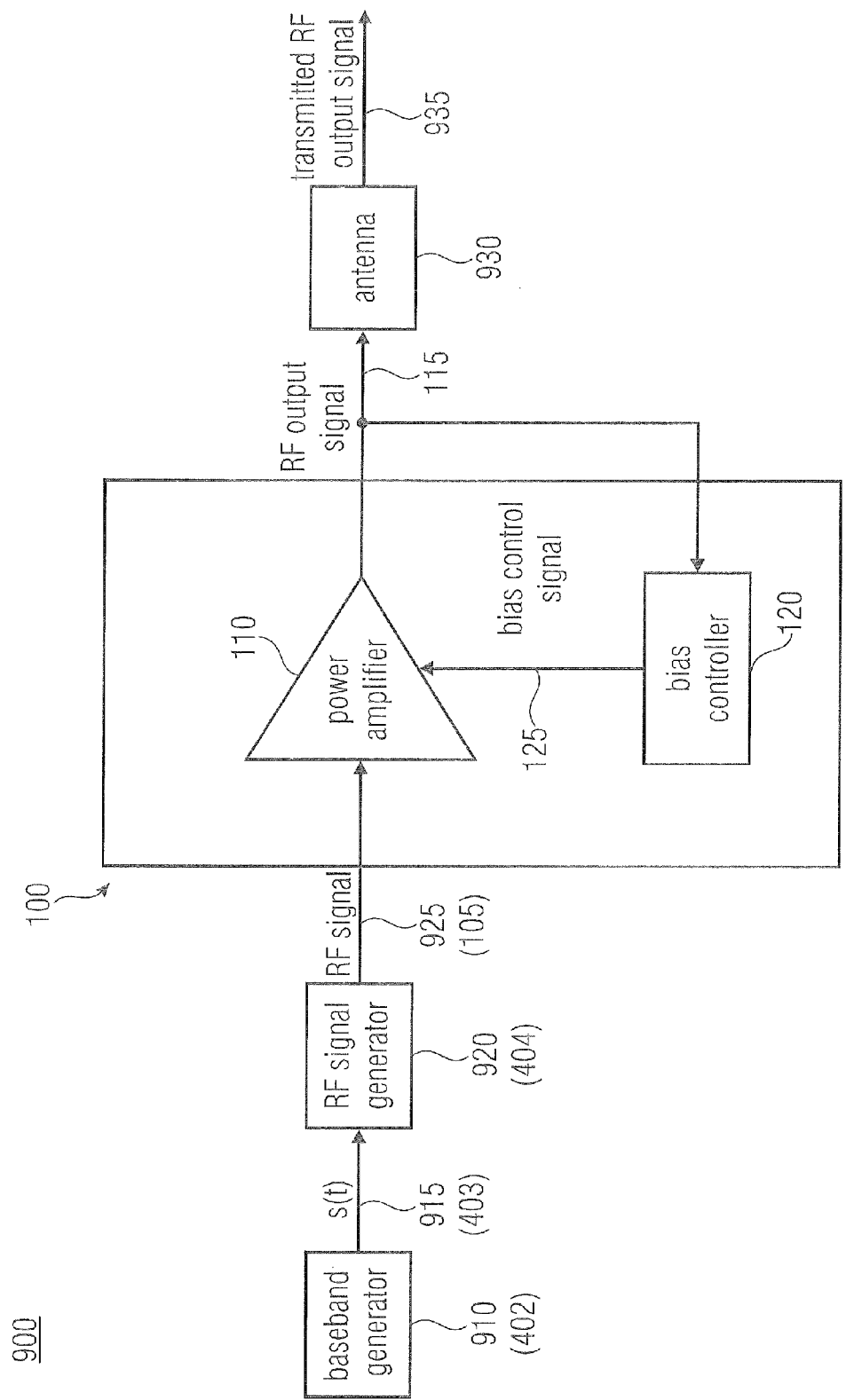
FIG. 9 shows a block diagram of an embodiment of a mobile communication device including the embodiment of the amplifier circuit in accordance with FIG. 1.

FIG. 9 shows a block diagram of an embodiment of a mobile communication device 900 including the embodiment of the amplifier circuit 100 in accordance with FIG. 1. As shown in FIG. 9, the mobile communication device 900 for transmitting an RF output signal may comprise a baseband generator 910, an RF signal generator 920, a power amplifier 110, a bias controller 120 and an antenna 930. Here, the power amplifier 110 and the bias controller 120 may constitute the amplifier circuit 100 as shown in the embodiment of FIG. 1. Therefore, similar blocks in FIG. 9 having similar implementations and/or functions as those in FIG. 1 are denoted by the same numerals. Moreover, the baseband generator 910 and the RF signal generator 920 of the mobile communication device 900 shown in FIG. 9 may correspond to the baseband generator 402 and the RF signal generator 404 shown in the embodiment of FIG. 4, while the baseband signal 915, s(t), and the RF signal 925 obtained from the baseband generator 910 and the RF signal generator 920 may correspond to the baseband signal 403, s(t), and the RF signal 405 obtained from the baseband generator 402 and the RF signal generator 404. In the embodiment of FIG. 9, the baseband generator 910 is configured to generate a baseband signal 915. The RF signal generator 920 may be configured for generating an RF signal 925 on the basis of the baseband signal 915. The power amplifier 110 is configured to receive the RF signal 925 from the RF signal generator 920 and for amplifying the received RF signal to obtain an RF output signal 115. The bias controller 120 is configured to control a bias of the power amplifier 110. Here, the bias controller 120 is configured to determine the measure $\Gamma_L$ (for example, a reflection factor) of a load impedance of a load coupled to an output of the power amplifier 110 and to provide a bias control signal 125 to adjust the bias of the power amplifier 110 based on the determination of the measure $\Gamma_L$ of the load impedance. The antenna 930 is configured to transmit the RF output signal 115 as a transmitted RF output signal 935.

Some embodiments according to the invention provide a better performance than conventional 3G mobile devices which use an isolator to keep good ACLR performance under antenna mismatch. The isolator resolved the linearity degradation under antenna mismatch, but had severe impact on size and cost. The increasing number of bands aggravated the cost- and size disadvantage of the isolator approach. As a result, the isolator was removed from most of the designs and eliminated by other approaches which shall also provide a load-insensitive behavior. Today, balanced power amplifiers are the most important class of load-insensitive power amplifier solutions. There are some design variants depending on the power amplifier supplier, but all implementations rely on a 90 deg hybrid as a core element to reduce the load sensitivity. One major disadvantage of each balanced power amplifier is that the load insensitivity is gained at the expense of lower power amplifier efficiency due to additional losses caused by the hybrid network. The peak efficiency of a balanced amplifier is typically in the range of 35-37%, whereas a single-ended power amplifier achieves more than 40%.

Some embodiments according to the invention provide a better tradeoff between efficiency and complexity than amplifiers having more headroom. It has been found that it is often a less effective approach to use a single-ended amplifier with more headroom of linear output power. Due to the extra linear power the ACLR degradation under mismatch is reduced. The advantages compared to a balanced power amplifier are less complex hardware, which allows more cost-effective and smaller size solutions. However, the impact on efficiency is even more severe than in case of a balanced power amplifier if same ALCR performance under mismatch for both architectures is presumed.

Some embodiments according to the invention provide a better tradeoff between efficiency and complexity than conventional software-based solutions. Apart from the hardware (HW) based solutions described above there are some software (SW) solutions, which are also aimed to improve ACLR under mismatch and which have less impact on efficiency, cost or power amplifier complexity. Good examples are predistortion and adaptive biasing. The disadvantage here is a significantly higher software complexity which, so far, impedes deployment in mobile devices.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In summary, embodiments of the invention offer an attractive solution for a problem which occurs in all mobile terminals based, for example, on 8PSK/GMSK (8-Phase Shift Keying/Gaussian Minimum Shift Keying), WCDMA or LTE. Embodiments of the present invention are mostly related to WCDMA, but could also be applied to solve similar problems in other fields.

Embodiments of the invention provide a procedure which combines a low software complexity with minimum (or, at least, reasonably small) impact on the hardware architecture, thereby allowing for a superior current consumption and ACLR performance under mismatch.

It is to be noted that the knowledge about the antenna impedance or the measurement thereof in a mobile device is important and a prerequisite for embodiments of this invention. Besides this, it is expected that in the future, many mobile devices will support the measurement of the antenna impedance due to other reasons. Such reasons, for example, can be to adjust an antenna tuner or to run a self-test, such as during the production to check whether the antenna is correctly assembled, etc.

As compared to a balanced power amplifier approach, embodiments of the invention have the benefits that a less complex power amplifier can be realized, thereby allowing for a smaller size and cost thereof, and that a higher 50 Ohm peak efficiency can be achieved.

In addition, as compared to pre-distortion, embodiments of the invention have the benefits that they provide less complex software algorithms, a fast settling time and a feed-forward implementation. Here, it is pointed out that in case of a fast settling time, just one measurement point is needed, while the feed-forward implementation can be made robust, thereby having no stability issues.

Essentially, embodiments of the invention provide a concept for setting the bias of a power amplifier depending on the measured load impedance. In some embodiments, a directional coupler may be used and the ACLR may be kept relatively constant over phase. In some further embodiments, other procedures like pre-distortion could also be employed, requiring a plurality of slots for settling the ACLR value.

The invention claimed is:

1. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the bias controller is configured to provide a first bias control signal as the bias control signal to adjust a supply voltage of the power amplifier.

2. The amplifier circuit of claim 1, wherein the bias controller is configured to further provide a second bias control signal as the bias control signal to adjust an input-sided bias voltage to adjust a quiescent current of the power amplifier.

3. The amplifier circuit of claim 1, wherein the power amplifier is configured to amplify the RF input signal based on the supply voltage and a quiescent current.

4. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the bias controller comprises a look-up table configured to store a plurality of bias voltage values associated with corresponding values of a reflection factor for a plurality of load impedances, such that the bias voltage values are dependent on a phase and amplitude of corresponding reflection factors for reflection factors of equal magnitude.

5. The amplifier circuit of claim 4, wherein the bias controller is configured to extract an individual bias voltage value from the look-up table, wherein the individual bias voltage value corresponds to a value of a reflection factor determined by the determined load impedance, and wherein the bias controller is configured to provide the bias control signal to adjust the bias of the power amplifier based on the individual bias voltage value extracted from the look-up table.

6. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the bias controller comprises different look-up tables for a plurality of different frequencies of the RF input signal, respectively, wherein each of the look-up tables is configured to store a plurality of bias voltage values associated with corresponding values of a reflection factor for a plurality of load impedances, such that the bias voltage values are dependent on a phase of corresponding reflection factors for reflection factors of equal magnitude.

7. The amplifier circuit of claim 6, wherein the bias controller is configured to extract an individual bias voltage value from a selected look-up table associated with a current frequency of the RF input signal, wherein the individual bias voltage value corresponds to a phase of a reflection factor determined by the determined load impedance for the current frequency of the RF input signal, and wherein the bias controller is configured to provide the bias control signal to adjust the bias of the power amplifier based on the individual bias voltage value extracted from the selected look-up table.

8. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the bias controller further comprises a DCDC converter configured to adjust a supply voltage of the power amplifier based on a mapped voltage determined by an entry of a look-up table.

9. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the bias controller comprises an impedance information look-up table configured to store a plurality of measures of a load impedance for corresponding frequencies of the RF input signal.

10. The amplifier circuit of claim 9, wherein the bias controller is configured to extract an individual measure of a load impedance from the impedance information look-up table, wherein the individual measure of the load impedance corresponds to a frequency of the RF input signal in a frequency hopping mode, and wherein the bias controller is configured to provide the bias control signal to adjust the bias of the power amplifier based on the individual measure of the load impedance extracted from the impedance information look-up table.

11. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the power amplifier is configured such that, for a constant supply voltage of the power amplifier, a dependence of an adjacent channel leakage power ratio value of the RF output signal on a phase of a reflection factor for a plurality of load impedances results in reflection factors of equal magnitude comprises a single peak within a total phase angle range.

12. The amplifier circuit of claim 1, further comprising a directional coupler configured to perform a reflection factor measurement that is based on the load impedance.

13. An amplifier circuit, comprising:
a power amplifier configured to amplify an RF input signal to obtain an RF output signal; and
a bias controller configured to control a bias of the power amplifier, wherein the bias controller is configured to determine a measure of a load impedance of a load coupled to an output of the power amplifier and provide a bias control signal to adjust the bias of the power amplifier based on the determination of the measure of the load impedance,
wherein the bias controller is configured to provide a maximum bias control signal to set the bias of the power amplifier to a maximum level before an initial time slot of a sequence of time slots, and wherein the bias controller is further configured to subsequently determine the measure of the load impedance, and provide a bias control signal that is different from the maximum bias control signal to adjust the bias of the power amplifier based on the determination of the measure of the load impedance for a consecutive time slot of the sequence of time slots.

14. The amplifier circuit of claim 13, wherein the bias controller is configured to perform the step of providing a maximum bias control signal to set the bias of the power amplifier to a maximum level before an initial time slot of the sequence of time slots, the step of subsequently determining the measure of the load impedance, and the step of providing a bias control signal that is different from the maximum bias control signal to adjust the bias of the power amplifier based on the determination of the measure of the load impedance for the consecutive time slot of the sequence of time slots for each frequency of a hopping sequence.

15. The amplifier circuit of claim 14, wherein the bias controller is configured to store measures of the load impedance for a plurality of frequencies, and reuse the stored measures of the load impedance when returning to a frequency previously used in the hopping sequence.

16. An amplifier circuit, comprising:

means for amplifying an RF input signal to obtain an RF output signal; and means for controlling a bias of the power amplifier, wherein the means for controlling is configured to determine a measure of a load impedance of a load coupled to an output of the means for amplifying and provide a bias control signal to adjust the bias of the means for amplifying based on the determination of the measure of the load impedance, wherein the means for controlling is configured to provide a first bias control signal as the bias control signal to adjust a supply voltage of the amplifying means.

17. A method for adjusting a bias of a power amplifier, the method comprising:

amplifying an RF input signal to obtain an RF output signal; and controlling the bias of the power amplifier, wherein the step of controlling comprises determining a measure of a load impedance of a load coupled to an output of the power amplifier and providing a bias control signal to adjust the bias of the power amplifier based on the determination of the measure of the load impedance, wherein the bias controlling comprises providing a first bias control signal as the bias control signal to adjust a supply voltage of the power amplifier.

18. An amplifier circuit, comprising:

a power amplifier configured to amplify an RF input signal to obtain an RF output signal; and a bias controller configured to control a bias of the power amplifier, wherein the bias controller is configured to measure a load impedance of a load coupled to an output of the power amplifier and provide a bias control signal to adjust the bias of the power amplifier based on the measured load impedance, wherein the bias controller is configured to provide a first bias control signal as the bias control signal to adjust a supply voltage of the power amplifier.

* * * * *